United States Patent [19]

Higashiyama

[11] Patent Number: 5,064,070

[45] Date of Patent: Nov. 12, 1991

[54] PACKAGING CONTAINER FOR CONTAINING DEVELOPER SHEETS THEREIN AND METHOD OF PACKAGING SUCH SHEETS

[75] Inventor: Shunichi Higashiyama, Yokkaichi, Japan

[73] Assignee: Brother Kogyo Kabushiki Kaisha, Japan

[21] Appl. No.: 549,965

[22] Filed: Jul. 9, 1990

[30] Foreign Application Priority Data

Jul. 25, 1989 [JP] Japan .................. 1-192206

[51] Int. Cl.⁵ .............................................. B65D 81/20
[52] U.S. Cl. ................................. 206/455; 354/275
[58] Field of Search ............... 206/213.1, 205, 455, 206/456, 627, 631, 484.1; 354/275; 355/27, 75

[56] References Cited

U.S. PATENT DOCUMENTS

| | | | |
|---|---|---|---|
| 3,954,173 | 5/1976 | Eaton | 206/455 |
| 4,139,643 | 2/1979 | Hix et al. | 206/627 |
| 4,150,744 | 4/1979 | Fennimore | 206/205 |
| 4,295,563 | 10/1981 | Becker et al. | 206/213.1 |
| 4,399,209 | 8/1983 | Sanders et al. | |
| 4,656,068 | 4/1987 | Raines | 206/631 |
| 4,769,175 | 9/1988 | Inoue | 206/484.1 |
| 4,861,695 | 8/1989 | Higashiya | 354/275 |
| 4,889,233 | 12/1989 | Torii | 206/455 |
| 4,909,390 | 3/1990 | Raine et al. | 206/455 |

*Primary Examiner*—Jimmy G. Foster
*Attorney, Agent, or Firm*—Oliff & Berridge

[57] ABSTRACT

A packaging container for and packaging method of developer sheets of the type which are superposed with a microcapsule-bearing sheet on which a latent image corresponding to an original has been formed has improved storage characteristics. In such a container, the developer sheets are accommodated in a box which is in an atmosphere of non-oxidative gas or inert gas such as nitrogen gas. The box is wrapped with a plastic film or metal foil. The developer sheets can be stored over a long time without occurrence of yellowing of the developer.

22 Claims, 1 Drawing Sheet

PACKAGING CONTAINER FOR CONTAINING DEVELOPER SHEETS THEREIN AND METHOD OF PACKAGING SUCH SHEETS

BACKGROUND OF THE INVENTION

1. Field of the Invention

This invention relates to a packaging container for containing developer sheets which are used in obtaining images by methods using pressure-sensitive, photosensitive and pressure-sensitive, or photo-sensitive and heat-sensitive sheets and also to a packaging method of the developer sheets.

2. Description of the Related Art

As shown in U.S. Pat. No. 4,399,209, developer sheets of the type mentioned above are used by superposing the same with a microcapsule-bearing sheet wherein a latent image has been formed by imagewise exposure to light and by pressing them together thereby forming a visible image on the developer sheet by color development between developer material coated on the developer sheet and materials flowed from the microcapsules.

A known packaging method comprises placing a predetermined number of developer sheets in a open-faced paper box and, after covering with a top open-faced box, wrapping with two or three strips of plastic film. This wrapping has the purpose of holding the boxes together at the time of transportation.

However, the conventional packaging container and packaging method for the developer sheets permits the developer sheets to contact with outside air. After storage over a long time, the developer on the sheet is liable to be oxidized and yellowed by the action of oxidizable materials contained in air. Using such developer sheets, desired color developing characteristics cannot be obtained with an attendant problem that the commercial value is lowered.

SUMMARY OF THE INVENTION

The present invention contemplates to solve the above problems and provides a packaging container and a packaging method for packaging developer sheets by which the developer sheets can be stored over a long time without a lowering of commercial value.

In order to achieve the above object, the present invention is characterized, in one aspect, in that the developer sheets are stored in an atmosphere of a non-oxidative gas. The packaging method for the storage is characterized in that an inert gas such as nitrogen is filled in a packaging container.

According to the present invention as arranged above, the developer sheets are stored in an atmosphere of a non-oxidative gas or inert gas such as nitrogen gas. In the absence of oxidizable materials, the developer on the sheet is prevented from yellowing. Of course, if a tightly sealed container is used, long-term storage is ensured. Even though a paper container or box which is unsatisfactory in airtightness is used, no problem arises when such a container is completely sealed by wrapping.

The present invention ensures the long-term storage of the developer sheets and is effective in coping with a high temperature situation at the time of transportation by ship. The improvement in the storage properties permits mass-production of the sheets at one time with a reduction of production costs.

The above and further objects and novel features of the invention will more fully appear from the following detailed description when the same is read in connection with the accompanying drawings. It is to be understood, however, that the drawings are for purpose of illustration only and are not intended as a definition of the limits of the invention.

DETAILED DESCRIPTION OF THE PREFERRED EMBODIMENTS

Embodiments of the invention are described with reference to the accompanying drawings.

Figure 1:
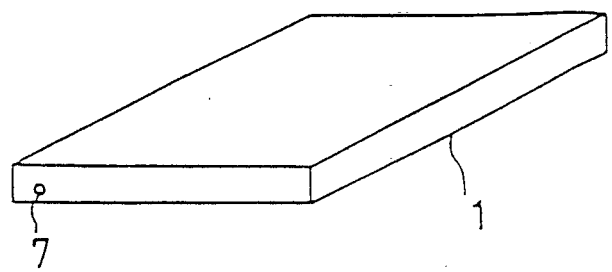
FIG. 1 is a schematic perspective view of a packaging container according to an embodiment of the invention.
Figure 2:
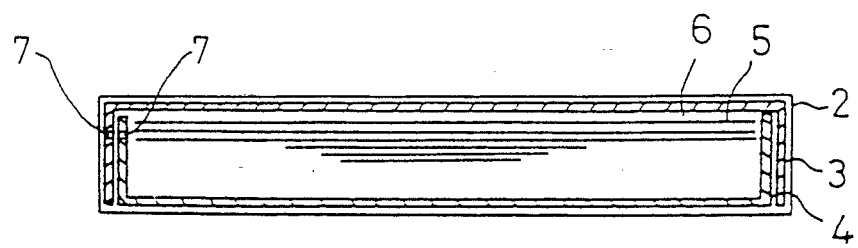
FIG. 2 is a sectional front view of the packaging container shown in FIG. 1.

FIG. 1 schematically shows an embodiment of a packaging container for carrying out a packaging method for developer sheets according to the invention. FIG. 2 shows an enlarged front sectional structure of the embodiment. In these figures, developer sheets 5 are accommodated in a lower open-faced box 4 made of a paper coated on one-side thereof with a 210 $\mu$m thick polymer film and nitrogen gas is filled in a space 6. The lower box 4 is covered with an upper open-faced box 3 made of the same material as the lower box 4. The entirety is wrapped with a wrapping film 2 to hermetically seal the container.

Figure 3:
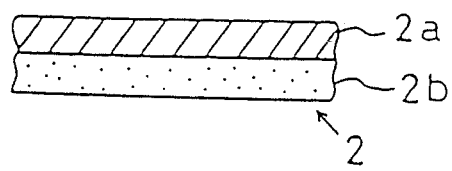
FIG. 3 is an enlarged sectional view of a wrapping film.

The upper box 3 and the lower box 4 are provided with a small-size hole 7 through which nitrogen gas is filled. The wrapping film 2 shown in an enlarged section view in FIG. 3 is made of a 25 $\mu$m thick polyethylene terephthalate film 2a and a 30 $\mu$m thick inflation film 2b of an ionomer which has been thermally bonded to the film 2a. The developer sheets 5 are obtained by preparing a developer coating solution obtained by dispersing 30 parts of a polymer of p-phenylphenol in 100 parts of water and mixing the solution with 3 parts of polyvinyl alcohol as a binder, and coating the solution on a 110 kg (weight per 1000 sheets) duodecimo both-side coated paper in a dry thickness of 15 $\mu$m.

The packaging method is now described. Two hundred developer sheets (A4 size, which means a paper size represented based on Japanese Industrial Standard (JIS)) are stacked and accommodated in the lower box 4, which is then covered with the upper box 3. At this stage, the difference between the capacity of the box and the volume of the two hundred developer sheets 5 is about 250 ml. While lightly pressing the upper box 3, 3 liters of nitrogen gas is blown in the container from the hole 7. By this, the air in the box is removed and the nitrogen gas fills the box. Immediately, the box is wrapped with the wrapping film 2 so that the polyethylene terephthalate film 2a is turned outside. Thereafter the overlapped portions of the ionomer inflation film are thermally bonded to the box by the use of a hot plate thereby completely hermetically sealing the box.

A storage test was effected using the developer sheets in such a completely hermetically sealed box filled with nitrogen gas as stated above (Example) and developer sheets placed in a conventional box (Comparative Example).

The developer sheets prior to the storage were subjected to colorimetric measurement of the L*a*b* system by the use of a spectral colorimeter and stored at 80° C. for 96 hours. After the storage, the respective developer sheets were also subjected to colorimetric measurement for comparison with the initial measured values. The results are shown in Table below.

|  | L* | a* | b* | Y.I. |
|---|---|---|---|---|
| Prior to Storage | 93.7 | 1.8 | −3.8 | −6.1 |
| After Storage |  |  |  |  |
| Example | 91.2 | −0.5 | 1.0 | 1.9 |
| Comp. Ex. | 85.3 | −0.7 | 16.3 | 31.5 |

The L*a*b* system is a method for representing color of material according to JIS Z 8729. L* is a lightness index representing a degree of color brightness. Both a* and B* are chromatic indexes which represent hue. All three indexes are calculated using equations as specified by JIS Z 8729.

The yellowness index (Y.I.) values in the Table are calculated from the respective measured values and show a degree of yellowness. As will become apparent from these results, the sheets stored according to the method of the example are very low in the yellowness index as compared with those stored by the known method (Comparative Example) and the method of the invention is evidenced as very effective.

In the example, a 210 μm thick one-side coated paper was used for the lower and upper boxes 3 and 4, and metal and plastic resin may be used for this purpose. The wrapping film 2 may be made of polypropylene, polyvinylidene chloride or the like. Alternatively, metal foils may also be used. Nitrogen gas was used, but other non-oxidative gases by which the developer undergoes little color change, e.g., rare gases such as helium, neon and argon may be used without limitation.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A packaging container comprising a container and developer sheets in a stacked state within the container and developer sheets in a stacked state within the container with remaining space inside the container, wherein the remaining space is completely filled with a non-oxidative gas and the container is hermetically sealed.

2. A packaging container according to claim 1, wherein the non-oxidative gas is an inert gas.

3. A packaging container according to claim 2, wherein the inert gas is nitrogen gas.

4. A packaging container according to claim 2, wherein the inert gas is a rare gas.

5. A packaging container according to claim 1, wherein the container is made of a paper coated with a polymer film.

6. A packaging container according to claim 5, wherein the container has a sealable hole through which the non-oxidative gas is filled into the container prior to hermetically sealing the container.

7. A packaging container according to claim 1, wherein the container is wrapped from an outside thereof by a film material.

8. A packaging container according to claim 7, wherein the film material for wrapping has a two layered structure constructed from two kinds of films bonded to each other.

9. A packaging container according to claim 8, wherein the two kinds of films comprise a polyethylene terephthalate film and an inflation film of an ionomer, which are thermally bonded to each other.

10. A packaging container according to claim 9, wherein the two kinds of films are wrapped on the container such that the polyethylene terephthalate film is turned outside.

11. A packaging container according to claim 1, wherein the container comprises two open-faced boxes made of one or more of a metal and a plastic resin and mated together.

12. A packaging container according to claim 7, wherein the film material for wrapping is made of a material selected from the group consisting of polyethylene terephthalate, polyethylene, polypropylene, polyvinylidene chloride and metal.

13. A packaging method for storing developer sheets in a container, comprising the steps of:
providing a container;
stacking the developer sheets in the container so as to leave a space inside the container;
filling the space completely with a nonoxidative gas; and
hermetically sealing the container.

14. A packaging method according to claim 13, wherein the container is hermetically sealed by wrapping the outside of the container with a film material.

15. A packaging method according to claim 14, wherein the non-oxidative gas comprises an inert gas.

16. A packaging method according to claim 15, wherein the inert gas comprises at least one of a nitrogen gas and a rare gas.

17. A packaging method according to claim 14, wherein the container is provided by mating two open-faced boxes made, respectively, of a material selected from the group consisting of paper coated with a polymer film, metal and plastic resin.

18. A packaging method according to claim 14, wherein the container is provided with a hole and the non-oxidative gas is filled through the hole.

19. A packaging method according to claim 14, wherein the film material is selected from the group consisting of polyethylene terephthalate, polyethylene, polypropylene, polyvinylidene chloride and metal.

20. A packaging method according to claim 14, wherein the film material for wrapping has a two layered structure constructed from two kinds of films bonded to each other.

21. A packaging method according to claim 20, wherein the two kinds of films comprise, respectively, a polyethylene terephthalate film and an inflation film of an ionomer, which are thermally bonded to each other.

22. A packaging method according to claim 21, wherein the two kinds of films are wrapped on the container such that the polyethylene terephthalate film is turned outside.

* * * * *